(12) United States Patent
Natori et al.

(10) Patent No.: US 7,573,120 B2
(45) Date of Patent: Aug. 11, 2009

(54) SEMICONDUCTOR DEVICE AND METHOD OF MANUFACTURING THE SAME

(75) Inventors: Katsuaki Natori, Yokohama (JP); Hiroyuki Kanaya, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 11/170,316

(22) Filed: Jun. 30, 2005

(65) Prior Publication Data
US 2006/0244022 A1 Nov. 2, 2006

(30) Foreign Application Priority Data
Apr. 28, 2005 (JP) .............................. 2005-132761

(51) Int. Cl.
*H01L 29/93* (2006.01)
(52) U.S. Cl. .............................. 257/532; 257/E27.017; 257/E27.095
(58) Field of Classification Search .................. 438/16, 438/3; 257/310, 303, 532, E27.017, E27.095
See application file for complete search history.

(56) References Cited

U.S. PATENT DOCUMENTS

| | | | |
|---|---|---|---|
| 5,960,252 A * | 9/1999 | Matsuki et al. ................ | 438/3 |
| 6,049,103 A * | 4/2000 | Horikawa et al. ........... | 257/303 |
| 6,144,060 A | 11/2000 | Park et al. | |
| 6,509,601 B1 * | 1/2003 | Lee et al. ..................... | 257/310 |
| 6,617,178 B1 * | 9/2003 | Aggarwal et al. ............. | 438/16 |
| 2005/0136554 A1 * | 6/2005 | Okita et al. .................... | 438/3 |

FOREIGN PATENT DOCUMENTS

| | | |
|---|---|---|
| JP | 2001-36026 | 2/2001 |
| JP | 2002-43541 | 2/2002 |

* cited by examiner

*Primary Examiner*—Davienne Monbleau
*Assistant Examiner*—Monica D Harrison
(74) *Attorney, Agent, or Firm*—Finnegan, Henderson, Farabow, Garrett & Dunner, L.L.P.

(57) ABSTRACT

According to an aspect of the present invention, there is provided a semiconductor device comprising a semiconductor substrate, a capacitor which is disposed above the semiconductor substrate and in which a dielectric film is held between lower and upper electrodes, an oxide film formed in such a manner as to coat the capacitor and having a thickness of 5 nm or more and 50 nm or less, and a protective film formed on the oxide film by an ALD process.

9 Claims, 3 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent. Application No. 2005-132761, filed Apr. 28, 2005, the entire contents of which are incorporated herein by reference.

BACKGROUND OF THE INVENTION

1. Field of the Invention

The present invention relates to a semiconductor device and a method of manufacturing the device, particularly to a semiconductor device having a capacitor using a dielectric and a method of manufacturing the device.

2. Description of the Related Art

In a ferroelectric random access memory (FeRAM) which is a nonvolatile memory utilizing a ferroelectric thin film, a capacitor portion of a DRAM is replaced with a ferroelectric material, and the memory is expected as the next-generation memory.

In the FeRAM, a ferroelectric thin film of PZT ($Pb(Zr_x Ti_{1-x})O_3$), BIT ($Bi_4Ti_3O_{12}$), SBT ($SrBi_2Ta_2O_9$) or the like is used for the capacitor portion. All of the films have a crystal structure based on a perovskite structure including an oxygen octahedron as a basic structure. These materials are different from a conventional Si oxide film in that ferroelectricity which is a characteristic is not developed in an amorphous state, and therefore cannot be used. Therefore, steps for crystallization, for example, crystallization thermal treatment at a high temperature, in-situ crystallization process at a high temperature and the like, are required. In general, a temperature of at least 400 to 700° C. is required for the crystallization depending on the material. As a film forming method, there are an MOCVD method, a sputtering method, and a chemical solution deposition (CSD) method.

Although the characteristics of an FeRAM capacitor utilizing the above-described ferroelectric material after forming a capacitor film are satisfactory, there has been a problem that step damage by diffusion of H or the like is incurred in subsequent steps such as an RIE step, interlayer film forming step, wiring step, and sintering, and in a process at a molding time, and capacitor characteristics are deteriorated.

Then, a protective film is used in order to reduce the damage in the post steps with respect to the capacitor. In Jpn. Pat. Appln. KOKAI Publication No. 2001-36026, a capacitor cell is described in which an Al oxide film is utilized as a protective film in a capacitor upper layer portion to thereby avoid damage.

On the other hand, as a structure of a capacitor, with high integration, development of an offset type in which the upper electrode of the capacitor is connected to an active region of a transistor to a capacitor-on-plug (COP) type in which the capacitor is disposed on a plug in order to prepare an FeRAM having a higher density has been advanced in recent years. In this COP type, a plug structure formed of W or Si connected from an active region of the transistor is disposed right under the capacitor, and the cell size can be reduced in the same manner as in a stacked capacitor of a DRAM.

However, in this structure, there has been a problem that a plug material disposed right under the capacitor is oxidized, contact resistance increases, and peeling occurs in a worst case in heat treatment under an oxygen-containing atmosphere for recovering damage. To avoid this problem, barrier layers such as TiAlN, TiN, TaSiN are formed, and electrode materials such as $IrO_2$, Ir, $RuO_2$, Ru have been tried.

However, in this case, since the structure is complicated, and the height of the capacitor increases, a problem occurs that the above-described protective film is not easily attached to the side wall of the capacitor. To solve the problem, in Jpn. Pat. Appln. KOKAI Publication No. 2002-43541, as a method of manufacturing an Al oxide film which is the protective film of the capacitor, an atomic layer deposition (ALD) method having a high step-coating property is used. An example of use of the ALD method is described in U.S. Pat. No. 6,144,060.

However, since trimethyl-aluminum (TMA) having a high reducing property is used in a source gas in the ALD method, which is one type of CVD method, there is a problem that the capacitor characteristics are deteriorated at the time of the film formation.

BRIEF SUMMARY OF THE INVENTION

According to an aspect of the present invention, there is provided a semiconductor device comprising: a semiconductor substrate; a capacitor which is disposed above the semiconductor substrate and in which a dielectric film is held between lower and upper electrodes; an oxide film formed in such a manner as to coat the capacitor and having a thickness of 5 nm or more and 50 nm or less; and a protective film formed on the oxide film by an ALD process.

According to another aspect of the present invention, there is provided a semiconductor device comprising: a semiconductor substrate; a capacitor which is disposed above the semiconductor substrate and in which a dielectric film is held between lower and upper electrodes; a first oxide film formed above the upper electrode; a first protective film formed on the first oxide film by an ALD process; a second oxide film formed in such a manner as to coat the first protective film, the first oxide film, and the capacitor; and a second protective film formed on the second oxide film by the ALD process.

According to another aspect of the present invention, there is provided a method of manufacturing a semiconductor device comprising: disposing a lower electrode above a semiconductor substrate, disposing a dielectric film above the lower electrode, and disposing an upper electrode above the dielectric film to thereby form a capacitor; forming an oxide film having a thickness of 5 nm or more and 50 nm or less in such a manner as to coat the capacitor; and forming a protective film on the oxide film by an ALD process.

DETAILED DESCRIPTION OF THE INVENTION

Embodiments will be described hereinafter with reference to the drawings.

Figure 1A:
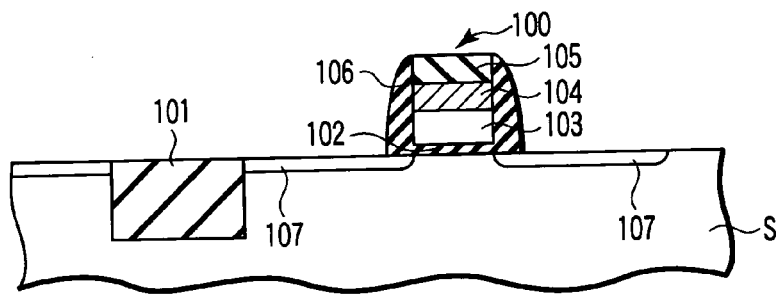
FIGS. 1A, 1B, 1C are sectional views showing a manufacturing process of an FeRAM according to a first embodiment.
Figure 1B:
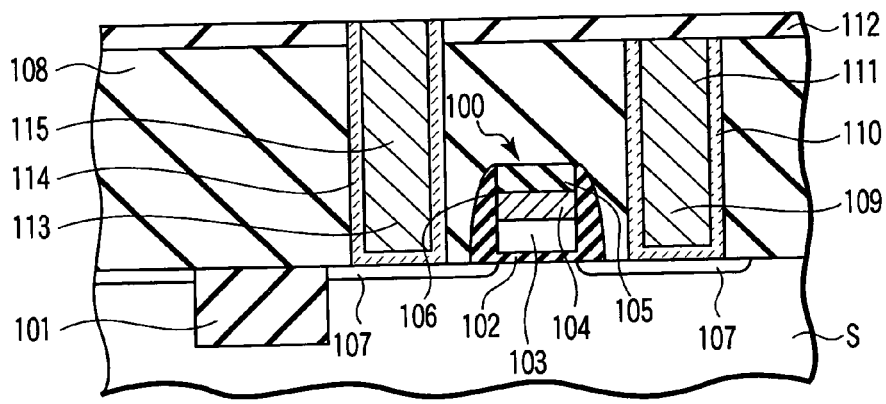
Figure 1C:
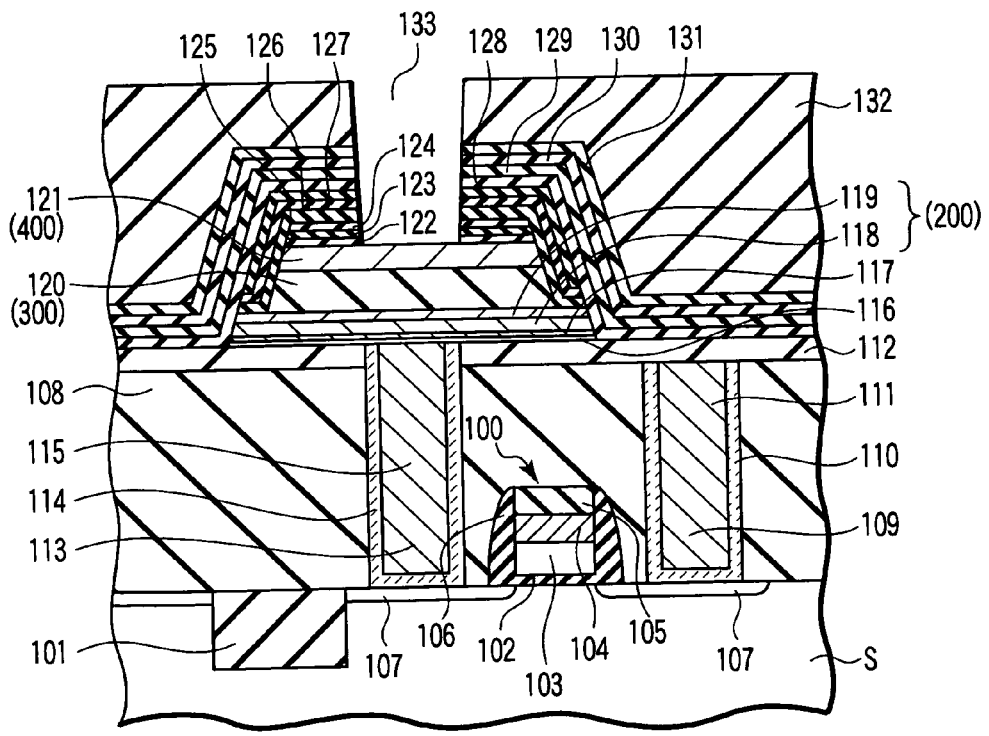

FIGS. 1A, 1B, 1C are sectional views showing a manufacturing process of an FeRAM according to a first embodiment.

In the first embodiment, a COP-type FeRAM cell using tungsten in a plug material positioned under a capacitor will be described.

First, as shown in FIG. 1A, a trench for element isolation is formed in a region except a transistor active region on a P-type Si substrate (semiconductor substrate) S surface, and $SiO_2$ is buried in the trench to form an element isolation region 101 (shallow trench isolation). Subsequently, a transistor for performing a switching operation is formed.

First, an oxide film 102 having a thickness of about 6 nm is formed on the whole surface of the Si substrate by thermal oxidation; subsequently an n+ type polycrystal silicon film 103 doped with arsenic is formed on the whole surface of the oxide film 102; further a $WSi_x$ film 104 is formed on the polycrystal silicon film 103, and a nitride film 105 is formed on the $WSi_x$ film 104. Thereafter, the polycrystal silicon film 103, $WSi_x$ film 104, and nitride film 105 are worked by a usual photolithography process and RIE process to form a gate electrode 100.

Furthermore, a nitride film 106 is deposited, and spacer portions are disposed on side walls of the gate electrode 100 by a side wall leaving technique by RIE. Moreover, source/drain regions 107 are formed by an ion implantation process and thermal treatment, although detailed description of the process is omitted.

Next, as shown in FIG. 1B, after a CVD oxide film 108 is deposited on the whole surface, planarization is performed once by a CMP process, and a contact hole 109 communicating with one source/drain region 107 of the transistor is formed. Thereafter, a thin titanium film is deposited by the sputtering process or CVD process, and a TiN film 110 is formed by performing the thermal treatment in a forming gas. Subsequently, CVD tungsten 111 is deposited on the whole surface, tungsten 111 is removed from a region outside the contact hole 109 by the CMP process, and tungsten is buried in the contact hole 109.

Thereafter, a CVD nitride film 112 is deposited on the whole surface; further a contact hole 113 communicating with the other source/drain region 107 of the transistor is formed, a TiN film 114 is similarly formed, tungsten 115 is buried in the contact hole 113, and a plug communicating with a capacitor is formed.

Thereafter, as shown in FIG. 1C, a silicon carbide film 116 having a thickness of 10 nm is deposited on the whole surface of the CVD nitride film 112, and subsequently a titanium film 117 having a thickness of about 3 nm is deposited on the whole surface of the silicon carbide film 116 by the sputtering process. Thereafter, an iridium film 118 having a thickness of 30 nm and a first platinum film 119 having a thickness of 20 nm constituting a capacitor lower electrode 200 are formed on the whole surface of the titanium film 117 by the sputtering process.

Furthermore, a PZT film 120 constituting a capacitor dielectric film 300 is formed on the first platinum film 119 by the sputtering process, and the PZT film 120 is once crystallized by a rapid thermal anneal (RTA) in an oxygen atmosphere. Thereafter, a second platinum film 121 constituting a capacitor upper electrode 400 is formed on the PZT film 120 by the sputtering process.

Thereafter, an oxide film ($SiO_2$ film) 122 having a thickness of 10 nm is deposited on the second platinum film 121 by a CVD process using $O_3$ and tetra ethoxy silane (TEOS) as source materials, and subsequently an $Al_2O_3$ film is formed as a first protective film 123 on the oxide film 122 by an ALD process. The film forming temperature is 200° C., and the film thickness is set to 5 nm. Subsequently, a CVD oxide film 124 is deposited as a working mask material on the first protective film 123, and the CVD oxide film 124 is patterned by the photolithography and RIE processes to remove a photo resist. Thereafter, the first protective film 123, oxide film 122, second platinum film 121, and PZT film 120 are etched by the RIE process.

Next, an oxide film ($SiO_2$ film) 125 having a thickness of 10 nm is deposited on the whole surface by the CVD process using $O_3$ and TEOS as source materials, and subsequently an $Al_2O_3$ film is formed as a second protective film 126 on the oxide film 125 by the ALD process. The film forming temperature is 200° C., and the film thickness is set to 10 nm. Subsequently, a CVD oxide film 127 is deposited as a working mask material on the second protective film 126, and the CVD oxide film 127, second protective film 126, oxide film 125, first platinum film 119, iridium film 118, titanium film 117, and silicon carbide film 116 are patterned in this order by combination of the photolithography and RIE processes. Thus the forming of the capacitor is completed.

Thereafter, an oxide film ($SiO_2$ film) 128 having a thickness of 10 nm is deposited on the whole surface by the CVD process using $O_3$ and TEOS as source materials, and subsequently an $Al_2O_3$ film is formed as a third protective film 129 on the oxide film 128 by the ALD process. The film forming temperature is 200° C., and the film thickness is set to 10 nm. Subsequently, an oxide film ($SiO_2$ film) 130 having a thickness of 50 nm is deposited on the third protective film 129 by the CVD process using $O_3$ and TEOS as source materials, and subsequently an $Al_2O_3$ film is formed as a fourth protective film 131 on the oxide film 130 by the ALD process. The film forming temperature is 200° C., and the film thickness is set to 10 nm.

Next, a CVD oxide film 132 is deposited on the whole surface to coat the capacitor, planarization is performed by CMP, the CVD oxide film 132 is patterned by the photolithography and RIE processes, and a contact hole 133 to the second platinum film 121 is formed. Subsequently, to remove damage caused on the PZT film 120 at a working time, thermal treatment is performed at about 600° C. in an oxygen atmosphere.

Thereafter, although not shown, an FeRAM is completed through steps of forming a drive line, a bit line, and further an upper-layer metal wiring.

As described above, according to the first embodiment, the oxide films 122, 125, 128, 130 are deposited by the CVD process using $O_3$ and TEOS as source materials before depositing the first, second, third, and fourth protective films 123, 126, 129, 131 by the ALD process. Accordingly, it is possible to reduce damage to the PZT film 120, caused at the time of the working, the depositing of the CVD oxide film, the depositing of the first, second, third, and fourth protective films 123, 126, 129, 131 ($Al_2O_3$ film) by the ALD process or the like. It is to be noted that when the thickness of each of the oxide films 122, 125, 128, 130 is 5 nm or more, the above-described effect is obtained, and the thickness is preferably 5 nm or more and 50 nm or less.

Figure 2:
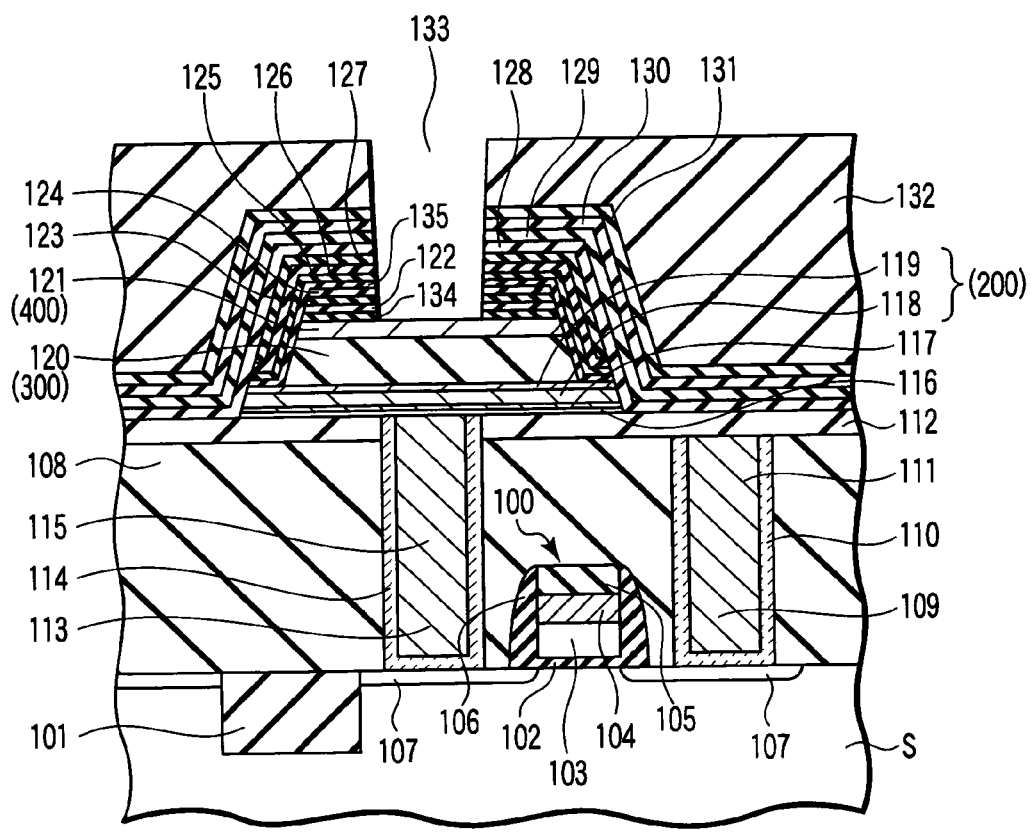
FIG. 2 is a sectional view showing a manufacturing process of the FeRAM according to a second embodiment.

FIG. 2 is a sectional view showing a manufacturing process of an FeRAM according to a second embodiment. In FIG. 2, the same parts as those of FIGS. 1A, 1B, and 1C are denoted with the same reference numerals.

In the second embodiment, a COP type FeRAM cell in which tungsten is used in a plug material positioned under a capacitor will be described. The basic process of the second embodiment is similar to that of the first embodiment, and an $Al_2O_3$ film is formed as an adhesive layer by a sputtering process under an oxide film by a CVD process using $O_3$ and TEOS as source materials.

After the process shown in FIGS. 1A, 1B in the first embodiment, as shown in FIG. 2, a silicon carbide film 116 having a thickness of 10 nm is deposited on the whole surface of the CVD nitride film 112 by the sputtering process, and subsequently a titanium film 117 having a thickness of about 3 nm is deposited on the whole surface of the silicon carbide film 116 by the sputtering process. Thereafter, an iridium film 118 having a thickness of 30 nm and a first platinum film 119 having a thickness of 20 nm constituting a capacitor lower electrode 200 are formed on the whole surface of the titanium film 117 by the sputtering process.

Furthermore, a PZT film 120 constituting a capacitor dielectric film 300 is formed on the first platinum film 119 by the sputtering process, and the PZT film 120 is once crystallized by a rapid thermal anneal (RTA) in an oxygen atmosphere. Thereafter, a second platinum film 121 constituting a capacitor upper electrode 400 is formed on the PZT film 120 by the sputtering process.

Thereafter, an $Al_2O_3$ film 134 having a thickness of 5 nm is deposited as an adhesive layer on the second platinum film 121 by the sputtering process. Next, an oxide film ($SiO_2$ film) 122 having a thickness of 10 nm is deposited on the $Al_2O_3$ film 134 by the CVD process using $O_3$ and TEOS as the source materials, and subsequently an $Al_2O_3$ film is formed as a first protective film 123 on the oxide film 122 by an ALD process. The film forming temperature is 200° C., and the film thickness is set to 5 nm. Subsequently, a CVD oxide film 124 is deposited as a working mask material on the first protective film 123, and the CVD oxide film 124 is patterned by the photolithography and RIE processes to remove a photoresist. Thereafter, the first protective film 123, oxide film 122, $Al_2O_3$ film 134, second platinum film 121, and PZT film 120 are etched by the RIE process.

Thereafter, an $Al_2O_3$ film 135 having a thickness of 5 nm is deposited as an adhesive layer on the whole surface by the sputtering process. Next, an oxide film ($SiO_2$ film) 125 having a thickness of 10 nm is deposited on the $Al_2O_3$ film 135 by the CVD process using $O_3$ and TEOS as the source materials, and subsequently an $Al_2O_3$ film is formed as a second protective film 126 on the oxide film 125 by the ALD process. The film forming temperature is 200° C., and the film thickness is set to 10 nm. Subsequently, a CVD oxide film 127 is deposited as a working mask material on the second protective film 126, and the CVD oxide film 127, second protective film 126, oxide film 125, $Al_2O_3$ film 135, first platinum film 119, iridium film 118, titanium film 117, and silicon carbide film 116 are patterned in this order by combination of the photolithography and RIE processes. Thus the forming of the capacitor is completed.

Thereafter, an oxide film ($SiO_2$ film) 128 having a thickness of 10 nm is deposited on the whole surface by the CVD process using $O_3$ and TEOS as the source materials, and subsequently an $Al_2O_3$ film is formed as a third protective film 129 on the oxide film 128 by the ALD process. The film forming temperature is 200° C., and the film thickness is set to 10 nm. Subsequently, an oxide film ($SiO_2$ film) 130 having a thickness of 50 nm is deposited on the third protective film 129 by the CVD process using $O_3$ and TEOS as the source materials, and subsequently an $Al_2O_3$ film is formed as a fourth protective film 131 on the oxide film 130 by the ALD process. The film forming temperature is 200° C., and the film thickness is set to 10 nm.

Next, a CVD oxide film 132 is deposited on the whole surface to coat the capacitor, planarization is performed by CMP, the CVD oxide film 132 is patterned by the photolithography and RIE processes, and a contact hole 133 to the second platinum film 121 is formed. Subsequently, to remove damage caused on the PZT film 120 at a working time, thermal treatment is performed at about 600° C. in an oxygen atmosphere.

Thereafter, although not shown, an FeRAM is completed through steps of forming a drive line, a bit line, and further an upper-layer metal wiring.

As described above, according to the second embodiment, the $Al_2O_3$ films 134, 135 are deposited under the oxide films 122, 125 using $O_3$ and TEOS as the source materials by the sputtering process before depositing the first and second protective films 123, 126. Accordingly, the oxide films 125, 122 are prevented from being peeled from the lower and upper electrodes. Moreover, it is possible to reduce damage on the PZT film 120, caused at the time of the working, depositing of CVD oxide film, and depositing the first and second protective films 123, 126 ($Al_2O_3$ films) by the ALD process or the like.

It is to be noted that in the first and second embodiments, an example has been described in which the oxide films are disposed under the four layers of the first, second, third, and fourth protective films 123, 126, 129, 131. However, it has been confirmed that there is an effect of reducing the damage on the PZT film 120, when the oxide film is simply disposed under the second protective film 126.

Moreover, PZT is used as a capacitor material in a ferroelectric film, and platinum is used in the upper and lower electrodes, but the materials are not limited to these materials. For example, SBT may be used as the ferroelectric film. As the electrodes, compound conductors such as iridium, ruthenium, and strontium ruthenium oxide may be used.

In the embodiments of the present invention, there are provided an inventive device structure having remarkably little deterioration of capacitor characteristics, and a method of manufacturing the structure in a semiconductor device using a protective film for the purpose of avoiding or reducing damage caused in a capacitor by RIE or plasma CVD in a capacitor forming step as in a capacitor manufacturing process in an FeRAM or DRAM having a high dielectric capacitor.

Usually, to obtain satisfactory characteristics of a capacitor dielectric film, thermal treatment is required in an oxygen-containing atmosphere in order to prevent oxygen loss and recover damage, so that the characteristics of the capacitor dielectric film are maintained against the damage on the capacitor, caused by the insulating film deposited by RIE or plasma CVD in the capacitor forming step. The temperature needs to be about 600° C. or more for the PZT film, and about 700° C. or more for the SBT film.

In this case, the plug material under the capacitor is oxidized, and problems occur in that peeling occurs and contact resistance increases. To avoid this, attempts have been made to form a barrier layer of a barrier metal or the like and to apply Ir or the like and oxide $IrO_2$ to an electrode material. The oxide itself has conductivity, and oxygen is not easily passed. However, it cannot necessarily be said that resistance to diffusion of oxygen is sufficiently high with respect to oxygen thermal treatment of the material. To raise this effect, there has been a disadvantage that the structure of the semiconductor device is complicated. There has also been a problem that the transistor characteristics are deteriorated in this thermal treatment step.

In the embodiments of the present invention, since these problems are solved, and it is possible to form a capacitor dielectric film having superior characteristics, there can be provided a high-reliability, fine, and highly integrated semiconductor such as an FeRAM or a DRAM. The effect will be concretely described hereinafter.

An Al oxide film has a hydrogen-resistant barrier property, and is effective as a protective film which prevents capacitor characteristics from being deteriorated in the RIE process, plasma CVD process, and sintering process. Usually, Al oxide is formed into a film by the sputtering process. In the capacitor of the FeRAM, a tapered angle of a capacitor side surface is about 60° in the case of integration of about 1 M, and the tapered angle of the capacitor side surface is 85° or more by miniaturization accompanying the high integration. In this case, it is difficult to deposit the Al oxide film onto the capacitor side surface by the sputtering process.

On the other hand, the forming of the Al oxide film by the CVD process has a satisfactory step-coating property, and especially the atomic layer deposition (ALD) process is superior in its step-coating property, and film thickness controllability. However, when the Al oxide film is formed by the ALD process, trimethyl aluminum (TMA) is used as a source gas, and capacitor characteristics are deteriorated by hydrogen generated from TMA at the time of the forming of the $Al_2O_3$ film.

However, when the oxide film is formed by the CVD process using $O_3$ and TEOS as the source materials before forming the protective film by the ALD process as in the embodiment of the present invention, the Al oxide film can be formed as the protective film without deteriorating the capacitor characteristics, and a ferroelectric capacitor cell avoiding damage by post-steps and having superior electrical characteristics can be obtained.

Figure 3:
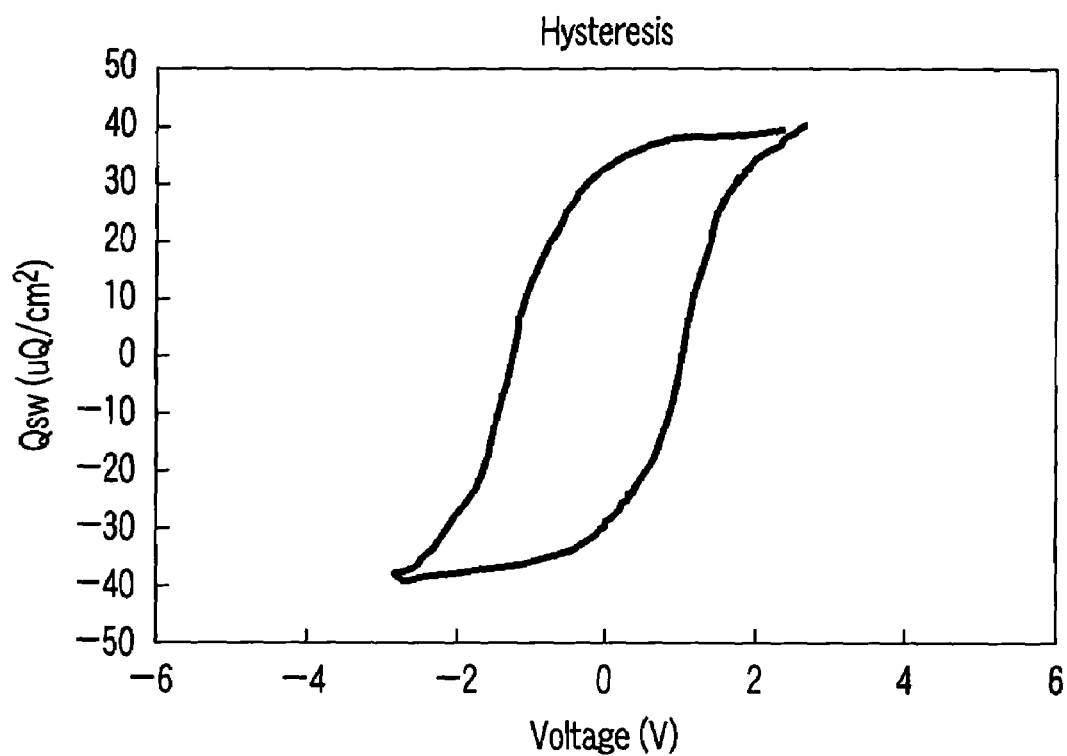
FIG. 3 is a diagram showing a hysteresis characteristic in an FeRAM capacitor manufactured according to the embodiment.

FIG. 3 is a diagram showing a hysteresis characteristic in an FeRAM capacitor manufactured according to the present embodiment. As can be seen from FIG. 3, a satisfactory hysteresis characteristic is obtained.

Figure 4:
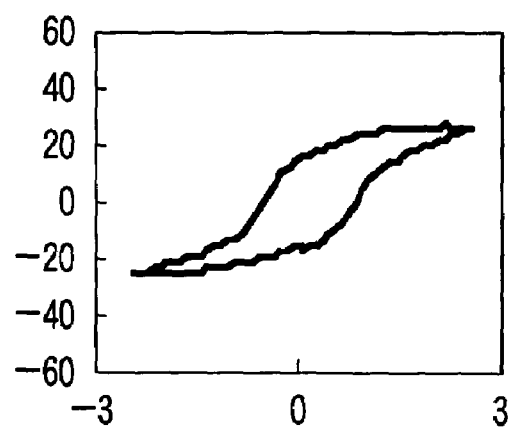
FIG. 4 is a diagram showing the hysteresis characteristic in the FeRAM capacitor according to the embodiment.

FIG. 4 is a diagram showing the hysteresis characteristic in the FeRAM capacitor, and showing a case where an oxide film is not formed before forming the protective film by the ALD process. It can be seen that the hysteresis characteristic by the present embodiment of FIG. 3 is satisfactory as compared with FIG. 4.

As described above, according to the present embodiments, there can be provided a semiconductor device in which a capacitor avoiding damage by post-steps and having superior characteristics is disposed in an FeRAM or a DRAM having a high dielectric film capacitor.

According to the embodiments of the present invention, there can be provided a semiconductor device comprising a ferroelectric capacitor avoiding damage by post-steps and having superior characteristics, and a method of manufacturing the device. That is, according to the embodiments of the present invention, since the oxide film is disposed under the protective film in the capacitor of the FeRAM, deterioration of the capacitor characteristics accompanying the forming of the protective film by the ALD process is avoided, and the characteristic deterioration accompanying the interlayer film forming step or the RIE can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
 a semiconductor substrate;
 a capacitor which is disposed above the semiconductor substrate and in which a dielectric film is held between lower and upper electrodes;
 a first silicon oxide film formed above the upper electrode;
 a first protective film formed on the first silicon oxide film by an ALD process;
 a second silicon oxide film formed in such a manner as to coat the first protective film, the first silicon oxide film, and the capacitor; and
 a second protective film formed on the second silicon oxide film by the ALD process.

2. The semiconductor device according to claim 1, wherein the first and second protective films are formed of Al oxide.

3. The semiconductor device according to claim 1, wherein the first and second silicon oxide films are formed by use of $O_3$ and TEOS.

4. The semiconductor device according to claim 1, further comprising a first adhesive layer formed between the capacitor and the first silicon oxide film.

5. The semiconductor device according to claim 4, wherein the first adhesive layer is an $Al_2O_3$ film.

6. The semiconductor device according to claim 1, further comprising a second adhesive layer formed between the first protective film and the second silicon oxide film.

7. The semiconductor device according to claim 6, wherein the second adhesive layer is an $Al_2O_3$ film.

8. The semiconductor device according to claim 1, wherein the dielectric film is a ferroelectric film.

9. The semiconductor device according to claim 8, wherein the ferroelectric film is PZT or SBT.

* * * * *